United States Patent [19]

Neuhof et al.

[11] Patent Number: 5,931,437
[45] Date of Patent: Aug. 3, 1999

[54] DEVICE FOR HOLDING PAPERS

[75] Inventors: Markus Neuhof, Ehringshausen-Niederlemp; Paul Root, Bad Endbach, both of Germany

[73] Assignee: Rittal-Werk Rudolf Loh GmbH & Co. KG Auf dem Stutzelberg, D-35745, Germany

[21] Appl. No.: 08/981,356

[22] PCT Filed: Jun. 25, 1996

[86] PCT No.: PCT/EP96/02758

§ 371 Date: Dec. 19, 1997

§ 102(e) Date: Dec. 19, 1997

[87] PCT Pub. No.: WO97/03838

PCT Pub. Date: Feb. 6, 1997

[30] Foreign Application Priority Data

Jul. 15, 1995 [DE] Germany ............................ 295 11 459

[51] Int. Cl.[6] ............................ B41J 11/02; A47B 97/04
[52] U.S. Cl. .................................. 248/442.2; 248/447.2; 248/918
[58] Field of Search ................................ 218/918, 442.2, 218/457, 447.2, 447, 452, 447.1, 451, 316.4, 218.4, 458, 282.1, 231.41; 400/718; 345/905, 903; 40/341; 312/223.3, 7.2, 280, 244, 223.2; 361/681, 682, 683; 211/26; 16/337, 338; 403/117, 164, 150

[56] References Cited

U.S. PATENT DOCUMENTS

| 2,015,280 | 9/1935 | Morishita | 248/451 |
|---|---|---|---|
| 4,632,471 | 12/1986 | Visnapuu | 312/233 |
| 4,693,443 | 9/1987 | Drain | 248/918 |
| 4,960,257 | 10/1990 | Waters | 248/918 |
| 5,035,392 | 7/1991 | Gross et al. | 248/918 |
| 5,074,512 | 12/1991 | Gianforcaro, II et al. | 248/918 |
| 5,082,235 | 1/1992 | Crowther et al. | 248/918 |
| 5,122,941 | 6/1992 | Gross et al. | 248/918 |
| 5,125,612 | 6/1992 | McNeal | 248/918 |
| 5,161,767 | 11/1992 | Hansen | 248/447.1 |
| 5,271,593 | 12/1993 | Kinner et al. | 248/442.2 |
| 5,292,099 | 3/1994 | Isham et al. | 248/442.2 |
| 5,383,642 | 1/1995 | Strassberg | 248/918 |
| 5,393,025 | 2/1995 | Franklin | 248/917 |
| 5,499,793 | 3/1996 | Salansky | 248/918 |
| 5,502,616 | 3/1996 | Maguire, Jr. | 248/918 |
| 5,526,180 | 6/1996 | Ruasnitz | 359/609 |
| 5,588,727 | 12/1996 | D'Agaro et al. | 248/918 |
| 5,627,606 | 5/1997 | Pember et al. | 348/818 |
| 5,683,070 | 11/1997 | Seed | 248/918 |
| 5,687,945 | 11/1997 | Lee | 248/918 |

FOREIGN PATENT DOCUMENTS

| 77700 | 12/1949 | Czechoslovakia | 248/451 |
|---|---|---|---|
| 0 569 316 | 11/1993 | European Pat. Off. | |
| 2 222 515 | 3/1990 | United Kingdom | |
| 88 06856 | 9/1988 | WIPO | |

*Primary Examiner*—Derek J. Berger
*Assistant Examiner*—Michael Nornberg
*Attorney, Agent, or Firm*—Jansson, Shupe, Bridge & Munger, Ltd.

[57] ABSTRACT

The invention relates to a control device with a housing, the open front of which is fitted with a closed front frame consisting of frame arms and corner connectors. For the easy fitting of components designed for ease of handling, vertical grip rods are fitted to both vertical sides of the front frame via two spacers and a design holder with a clamping strip is fitted to one grip rod by means of clamps.

11 Claims, 2 Drawing Sheets

DEVICE FOR HOLDING PAPERS

FIELD OF THE INVENTION

This invention is related generally to a control device and, more particularly, to the housing of a control device that is capable of receiving a variety of electrical components.

BACKGROUND OF THE INVENTION

Control devices as a rule, have an open front side that is covered with a face plate that bears operating and display elements. Such control devices are attached to support columns or on the end of a support arm system and, as a rule, can be variably positioned. For this, the housings of common control devices are provided with handles that simplify the handling of same.

OBJECTS OF THE INVENTION

It is an object of this invention to provide a control device that overcomes some of the problems and shortcomings of devices of the prior art.

Another object of this invention is to provide a control device whereby elements are attached in a simple manner thereby allowing for ease of handling. How these and other objects are accomplished will become apparent from the following descriptions and from the drawings.

SUMMARY OF THE INVENTION

The invention is comprised of a housing having an open front side and a closed front frame comprising frame members and corner connectors. Handlebars are attached on both vertical side of the front frame by means of two spacers, and a copy holder, having a clamping strip, is attached to one of the handlebars by means of connection clamps.

The handlebars are spaced away from the vertical sides of the housing in order to allow them to be securely gripped. The copy holder, depending on the type of use, can be selectively attached on the left or right side of the control device. A schematic, operating instruction or a sheet of paper can be clamped by a clamping strip. In any case, a convenience is rendered to the user during maintenance, repairs or servicing of the control device.

In one embodiment of the invention, the spacers feature blind hole type receptacles in which a handlebar, constructed as a pipe section, is inserted. Such insertion allows the handlebars to be connected to the spacers without any additional means of fastening. Advantageously, a press fit and/or force fit is used between the receptacle in the spacers and the handlebars.

The handling of the control device when changing its position is simplified even more if the spacers are angled such that the handlebars are arranged in front of the front side of the housing.

In another embodiment of the invention, the copy holder having a flat design is provided with an angle edge on the side facing the handlebar. Such angled edge is then screwed to the connecting clamps thereby attaching the copy holder to the handlebar.

The connecting clamps surrounding the handlebar have a U-shaped structure and feature a round receptacle for the handlebars. The arms of the connecting clamps are constructed in connection with the receptacle as a fastening flange having fastening bore holes. Such construction allows the edge of the copy holder to be screwed directly onto the fastening flange of the connecting clamps.

In a more preferred embodiment of the invention, the copy holder is connected to the connecting clamps such that it is capable of both pivoting on the handlebar and being fixed in a set pivoted position. Such embodiment allows the user to optimally adapt the copy holder position.

In still another more preferred embodiment, the copy holder is rectangularly constructed such that its larger dimension is aligned in parallel with the handlebar, whereby the edge of the flat copy holder is connected to the end portions of the handlebar by means of two connecting clamps. Given that in any case, the corner connector must be connected to the frame member of the front frame, a design that is characterized by having the spacers connected, e.g., screwed to the facing corner connectors of the front frame is advantageous.

The invention is explained in more detail on the basis of an exemplified embodiment illustrated in the drawings.

BRIEF DESCRIPTION DRAWINGS

DETAILED DESCRIPTION OF THE PREFERRED EMBODIMENTS

Figure 1:
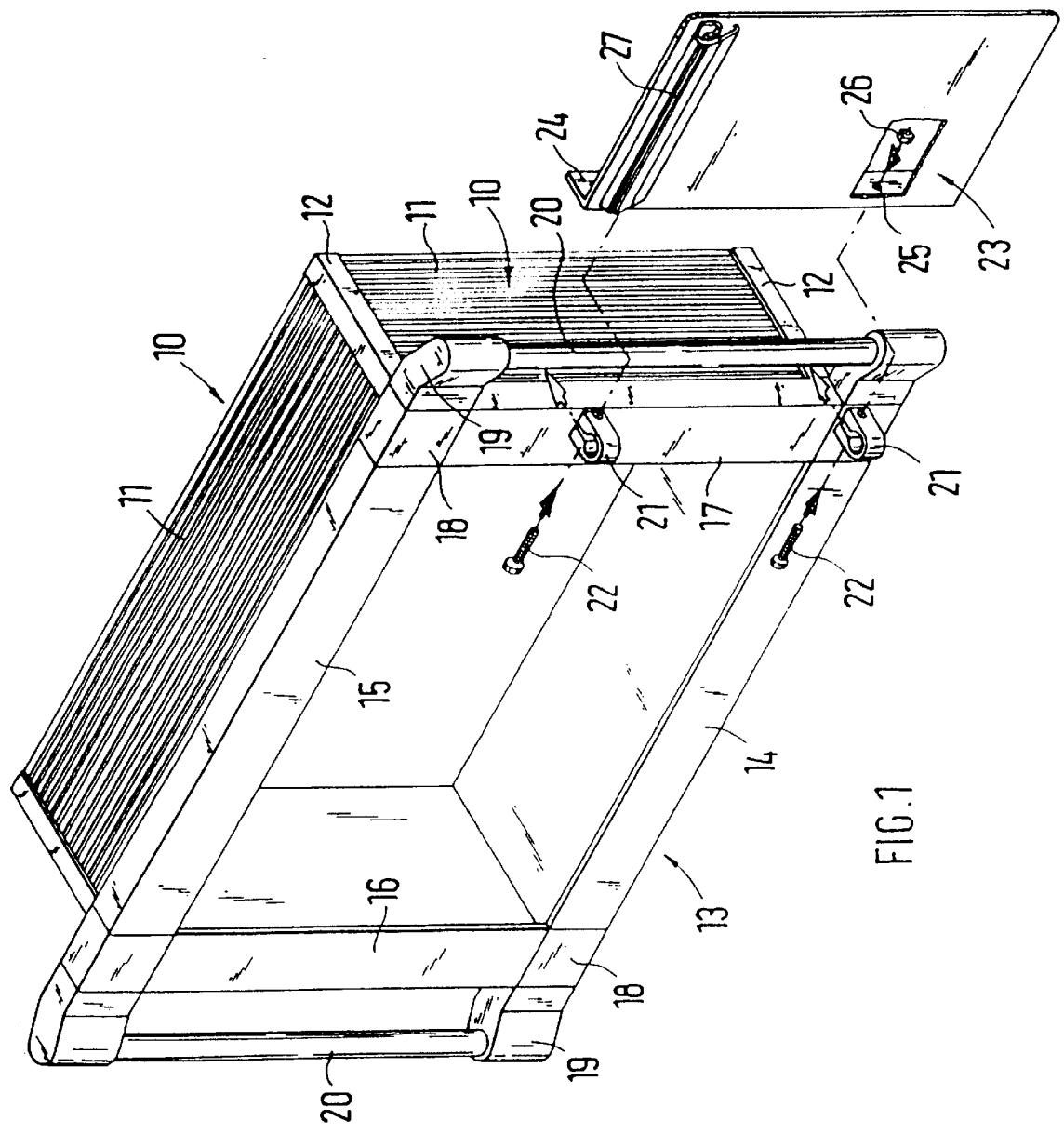
FIG. 1 is a perspective showing the front view of a control device, by which the housing, having no components, is provided with a handlebar on both sides, and whereby the parts provided for the attachment of the copy holder are in the assembled position.

The housing 10 of the control device is assembled of wall elements 11 and corner pieces 12. The open front side of the housing 10 is covered by a closed front frame 13. The front frame surrounds a receptacle that can be closed by means of a front plate or the like. The front frame which is rigidly connected to the housing 10, is assembled of four frame members 14, 15, 16 and 17, as well as four corner connectors 18. Angled spacers 19 are connected to the corner connectors 18 at both vertical sides of the front frame 13, said spacers having blind hole receptacles for the handlebars 20 on the sides that face each other. The handlebars 20 are designed as pipe sections and are inserted in these receptacles of the spacers 19. Such handlebars 20 are advantageously held in place through a press fit or a force fit. The spacers 19 are angled such that the handle bars 20 are arranged at a distance from the housing 10 and in front of the front side of the control device.

On the right handlebar 20 two U-shaped connecting clamps 21 can be clamped on, each clamp 21 featuring a round receptacle for the handlebars 20. In connection with these receptacles the arms of the connecting clamps 21 form fastening flanges provided with fastening bore holes. The flat copy holder 23 is aligned vertically with regard to its larger dimension. On its upper edge, such copy holder 23 bears a clamping strip 27 which can be used to affix a either a schematic, operating instruction, note page or the like. The side of the copy holder 23 facing the handlebar 20 is provided with an edge 24 angled rearward and having fastening bore holes 25. The edge 24 of the copy holder 23 can be screwed directly to the fastening flanges of the connecting clamps 21. The fastening screws 22 can thereby also be used to arrest the pivot position of the copy holder 23.

Figure 2:
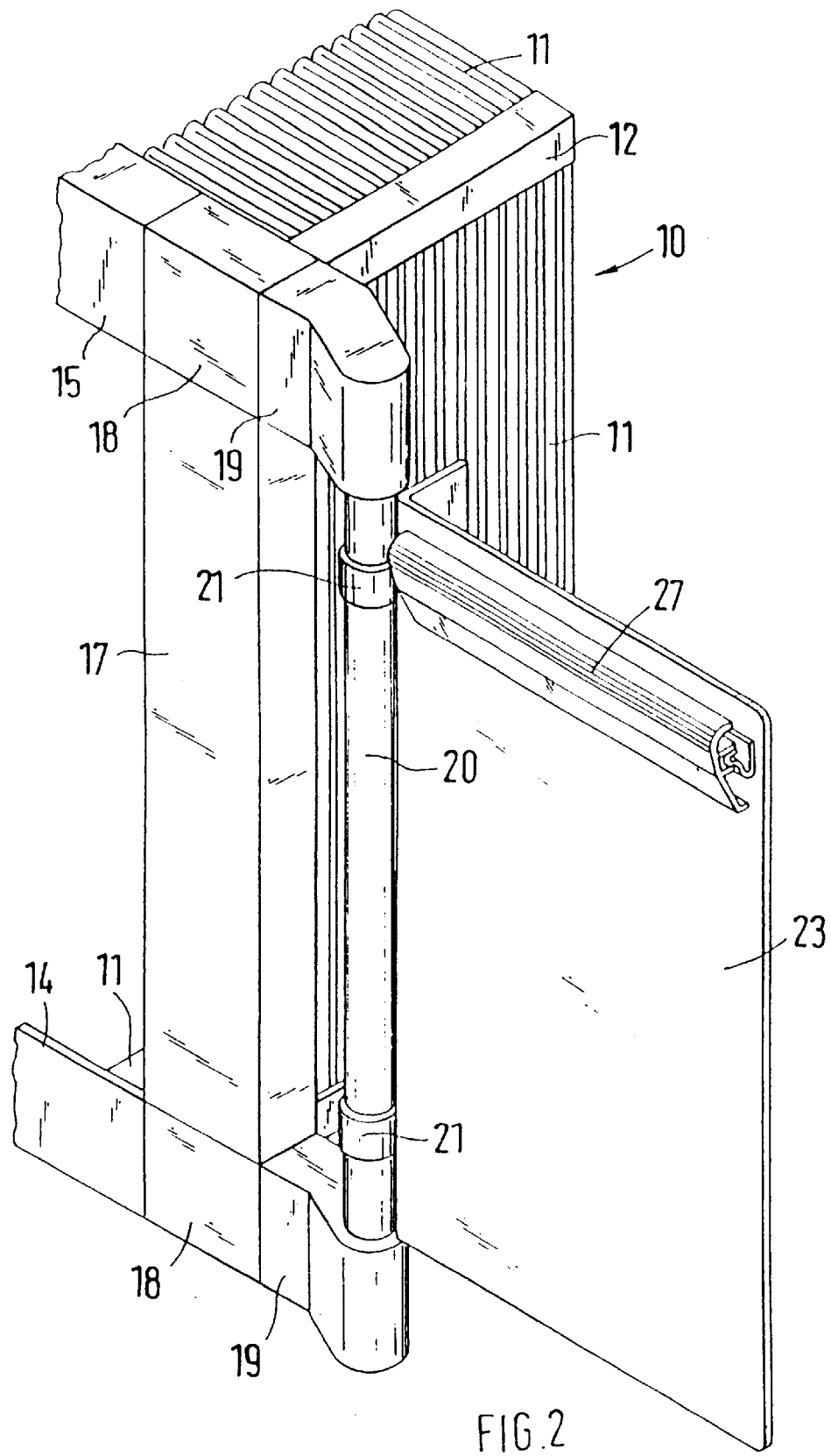
FIG. 2 is an enlarged partial view of the copy holder attached to the right handlebar.

As is shown in FIG. 2, both connecting clamps 21 are positioned in the vertical end area of the handle bar 20, so that a most rigid connection with regard to twisting is achieved between the handle bar 20 and the concept holder 23.

The spacers 19 are rigidly connected to the corner connectors 18 of the front frame 13, e.g., screwed. The corner connectors 18 themselves are, in turn, connected to the frame members 14, 15, 16, and 17, so that the front frame 13 and the copy holder 23 form a stable unit.

While the principles of this invention have been described in connection with specific embodiments, it should be understood clearly that these descriptions are made only by way of example and are not intended to limit the scope of the invention.

What is claimed:

1. A device for holding papers comprising:

a housing having an open front side surrounded by a front frame, the front frame having a pair of vertical frame members, a pair of horizontal frame members positioned such that the first horizontal frame member is adjacent to a top surface of the housing and the second horizontal frame member is adjacent to a bottom surface of the housing, and a plurality of corner connectors;

a pair of spacers rigidly affixed in a non-adjustable manner to the corner connectors where said connectors are separately connected to each end of the horizontal and vertical frame members; a handlebar positioned between each pair of spacers substantially parallel to the vertical frames; and a pair of pivotally-mounted connecting clamps affixed to at least one of the handlebars, each clamp having a circular aperture therethrough and each clamp being around the said one of the handlebars thereby allowing for vertical sliding movement thereon, whereby a copy holder having a clamping strip is connected to the handlebar.

2. The device of claim 1 wherein:

the handlebars have a first and a second end; and each spacer includes a hole type receptacle capable of receiving either the first or second end of a handlebar.

3. The device of claim 1 wherein the spacers are angled such that the handlebars are arranged in front of the open front side of the housing.

4. The device of claim 1 wherein:

the copy holder includes a flat front surface;

an angled edge is connected to one side of the front surface; and the angled edge is fastened to the connecting clamps.

5. The device of claim 1 wherein:

the connecting clamps are U-shaped and include a round receptacle capable of receiving a handlebar; and the connecting clamps include arms with each arm having a fastening bore hole.

6. The device of claim 1 wherein the copy holder is connected to the connecting clamps in such a manner as to allow the connecting clamps to pivot on the handlebar.

7. The device of claim 6 wherein the connecting clamps are capable of being fixed in a set pivot position.

8. The device of claim 1 wherein the copy holder is rectangular in shape and is aligned such that the larger side of the rectangle is parallel to the handlebar.

9. The device of claim 7 wherein:

the flat copy holder includes a first edge;

a connecting clamp is attached near both the first and the second end of the handlebar; and the connecting clamps connect the first edge of the copy holder to the handlebar.

10. The device according to claim 1 wherein the spacers are connected to the facing corner connectors of the front frame.

11. The device according to claim 1 wherein the spacers are screwed to the facing corner connectors of the front frame.

* * * * *